(12) United States Patent
Weber-Rabsilber et al.

(10) Patent No.: US 7,360,923 B2
(45) Date of Patent: Apr. 22, 2008

(54) LIGHT-EMITTING DIODE CARRIER

(75) Inventors: Sven Weber-Rabsilber, Neutraubling (DE); Nadir Farchtchian, Santa Clara, CA (US); Naceur Chaabane, Fürth (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/770,977

(22) Filed: Feb. 2, 2004

(65) Prior Publication Data

US 2004/0175189 A1    Sep. 9, 2004

(30) Foreign Application Priority Data

Jan. 31, 2003  (DE) ................................ 103 03 969

(51) Int. Cl.
*F21V 21/00*    (2006.01)

(52) U.S. Cl. ...................... 362/241; 362/240; 362/247; 362/249

(58) Field of Classification Search ........ 362/240–241, 362/245, 257, 331, 545, 555, 800; 313/500, 313/512
See application file for complete search history.

(56) References Cited

U.S. PATENT DOCUMENTS 3,954,534 A  *  5/1976  Scifres et al. ................. 438/29
4,703,219 A  *  10/1987  Mesquida .................... 313/111
5,835,269 A  *  11/1998  Natori ......................... 359/448
6,113,247 A  *  9/2000  Adams et al. ............... 362/237
6,428,189 B1 *  8/2002  Hochstein ................... 362/373
6,435,691 B1 *  8/2002  Macey et al. ............... 362/101
6,450,663 B1    9/2002  Reinbach
6,577,332 B2 *  6/2003  Osawa et al. ............... 347/241
6,825,420 B2 *  11/2004  Schreck et al. ........... 174/117 F

FOREIGN PATENT DOCUMENTS

DE        199 33 060        4/2001
EP        0 921 568 A2      6/1999

OTHER PUBLICATIONS

German Office Action dated Nov. 9, 2007 issued in corresponding application No. 103 03 969.4-33.

\* cited by examiner

*Primary Examiner*—Thomas M. Sember
(74) *Attorney, Agent, or Firm*—Cohen Pontani Lieberman & Pavane LLP

(57) ABSTRACT

In a light-emitting diode carrier 1, a plurality of light-emitting diodes 9 are mounted on the rear side 3 of the light-emitting diode carrier and project into a plurality of openings 2. During operation, the light-emitting diodes 9 radiate through the openings 2 of the light-emitting diode carrier 1. A film 10 is applied on the front side 4 of the light-emitting diode carrier 1, said film being transmissive to the radiation emitted by the light-emitting diodes and protecting the light-emitting diode carrier from ambient influences.

13 Claims, 2 Drawing Sheets

LIGHT-EMITTING DIODE CARRIER

RELATED APPLICATION

This patent application claims the priority of German patent application 10303969.4, the disclosure content of which is hereby incorporated by reference.

FIELD OF THE INVENTION

The invention relates to a light-emitting diode carrier having a plurality of light-emitting diodes.

BACKGROUND OF THE INVENTION

In order to produce large displays, light-emitting diode carriers, such as circuit boards, for example, are populated with light-emitting diodes. Circuit boards are conventionally populated on two sides, that is to say the light-emitting diodes are situated on the front side and plug connectors, in part also in conjunction with other electronic components, are arranged on the rear side. Since the light-emitting diodes are situated on the front side of the light-emitting diode carrier, they are unprotected from mechanical loading and ambient influences, above all in outside applications. Protection from rain and atmospheric humidity can be achieved by potting the light-emitting diodes for example with a silicone composition or by mounting the displays in a sealed housing with a light-transmissive wall made of glass or plastic. Mechanical protection of the light-emitting diodes can be achieved by application of a perforated mask.

In these procedures, the problem arises that the protection of the light-emitting diodes of a large display from external influences is realized by means of a comparatively large outlay. Furthermore, light-emitting diodes mounted on the front side with their housing, with soldering points and other parts reflect light radiated in externally, so that the contrast between the light-emitting diodes and the nonradiating part of the circuit board is relatively low. Moreover, potting the light-emitting diodes requires a very high material outlay and a perforated mask only fulfills mechanical protection but without keeping moisture away from the light-emitting diodes.

SUMMARY OF THE INVENTION

One object of the present invention is to provide a light-emitting diode carrier which makes it possible to produce LED displays, in particular large displays in which light-emitting diodes are fitted with good contrast between the light-emitting diodes and the light-emitting diode carrier and are simultaneously protected from ambient and mechanical influences.

This and other objects are attained in accordance with one aspect of the present invention directed to a light-emitting diode carrier having a plurality of light-emitting diodes, wherein the light-emitting diode carrier has a plurality of openings. The plurality of light-emitting diodes are arranged on a rear side of the light-emitting diode carrier in such a way that they project into the openings in the carrier so they can radiate through the openings toward a front side of the light-emitting diode carrier.

In a preferred variant of the light-emitting diode carrier, the openings have a reflective surface, so that the side walls of the openings act as reflectors and that part of the radiation emitted by the light-emitting diodes which does not radiate directly through the openings is radiated toward the front side of the light-emitting diode carrier after one or multiple reflection at the side walls of the openings.

In a particularly preferred variant of the invention, the openings expand toward the front side. This makes it easier for the radiation to pass through the openings of the light-emitting diode carrier both with and without reflection at the side walls.

In this case, it is particularly advantageous if the side walls expand conically toward the front side. However, it is also possible to use any other advantageous geometry for radiating through the openings with the least possible losses and with or without reflection at the side walls, such as, for example, a shaping of the side walls of the openings expanding toward the front side which is convex as seen from the front side of the light-emitting diode carrier.

In a preferred variant of the light-emitting diode carrier according to the invention, a film is applied on the front side of the light-emitting diode carrier, said film being transmissive to the radiation emitted by the light-emitting diodes. Said film fulfills the task of protecting the light-emitting diode carrier. The light-emitting diodes are protected from moisture, such as condensation water and rain, from the front side of the light-emitting diode carrier after the application of the film. Furthermore, the film affords protection from foreign bodies and dust. Since the light-emitting diodes are arranged on the rear side of the light-emitting diode carrier, the film can easily be applied onto the whole area or a big part of the area of the plane surface of the front side. This is a considerable advantage over conventional light-emitting diode carriers in which the light-emitting diodes are situated on the front side, so that protection of the light-emitting diodes from ambient influences can be realized only with a high outlay.

In a further preferred embodiment of the light-emitting diode carrier according to the invention, a lens array is arranged on the front side of the light-emitting diode carrier in such a way that a lens of the lens array is situated above a respective opening. The lens array may be part of the protective film or be applied in addition to the film or instead of the film.

In a particular preferred embodiment, the lens array is exchangeable depending on the desired radiation characteristic. Consequently, a display, once it has been constructed, can be used in different areas of application by simply exchanging the lens array.

In a further advantageous variant, the front side of the light-emitting diode carrier is formed in radiation-absorbing fashion. In the case of visible light, this is achieved for example by means of a coating with a black color or with the use of material that is already black for the light-emitting diode carrier.

In a particular preferred variant, the light-emitting diode carrier is provided with any desired color by coating or by coloring in order to set a desired contrast between the light-emitting diode carrier and the light-emitting diodes.

BRIEF DESCRIPTION OF THE DRAWINGS

Further advantages, advantageous embodiments and developments of the light-emitting diode carrier emerge from the exemplary embodiments explained below in conjunction with the drawings, in which.

DETAILED DESCRIPTION OF THE DRAWINGS

Figure 1:
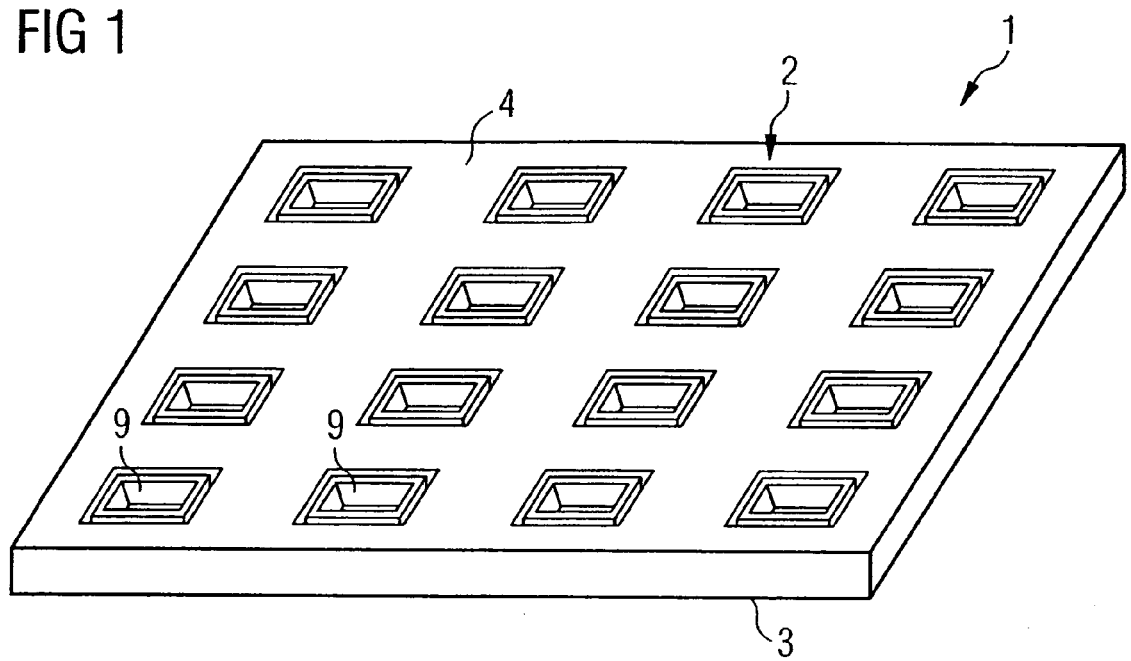
FIG. 1 shows a diagrammatic perspective illustration of a light-emitting diode carrier according to the invention.
Figure 2:
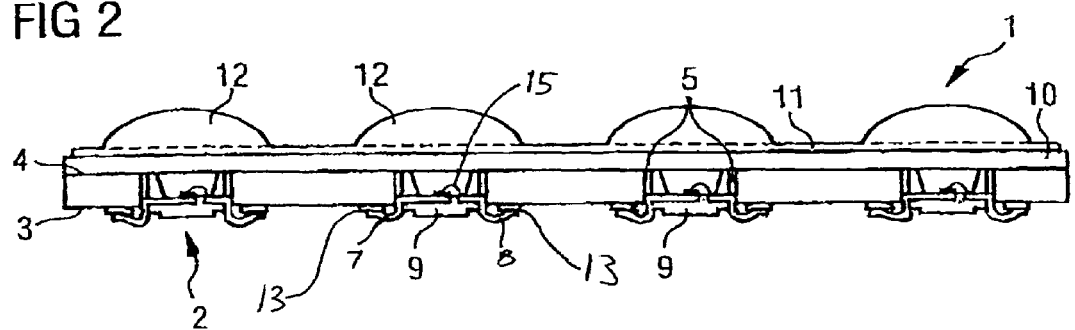
FIG. 2 shows a diagrammatic sectional illustration of a light-emitting diode carrier according to the invention as shown in FIG. 1, but with the addition of film 10.

FIG. 1 shows a light-emitting diode carrier 1, a plurality of light-emitting diodes (LEDs) 9 being mounted on the rear side of the light-emitting diode carrier and projecting into a plurality of openings 2. The bottom side of each LED is electrically connected to a first electrical connection 7, e.g. by soldering, while the upper side is connected to a second electrical connection 8, e.g. via a bonding wire 15, as shown in FIG. 2. Electrical connections 7 and 8 are embedded into carrier 1. They are bent in such a way that they form a kind of spring. Thus, if the LED is pushed further into opening 2, the force is received by the spring and causes elastic deformation of the spring, which minimizes the risk of delamination at the interface of the carrier.

During operation, the light-emitting diodes radiate through the openings of the light-emitting diode carrier. The light-emitting diodes are fixed on the rear side 3 of the light-emitting diode carrier 1 and are electrically connected via the electrical connections 7 and 8 to conductor tracks 13 (see FIG. 2) on the rear of light-emitting diode carrier 1, for example by means of soldering. As a result, there are no reflective parts of the light-emitting diodes which project to the front side of the light-emitting diode carrier and which would impair the contrast between light-emitting diodes and light-emitting diode carrier during operation.

The side walls 5 of the openings 2 have a reflective surface. This increases the degree of coupling-out of the radiation from the light-emitting diode carrier 1 since radiation which is emitted by the light-emitting diodes 9 and does not radiate directly through the openings 2 is radiated toward the front side 4 of the light-emitting diode carrier 1 after one or multiple reflection at the side walls 5 of the openings 2.

Figure 3:
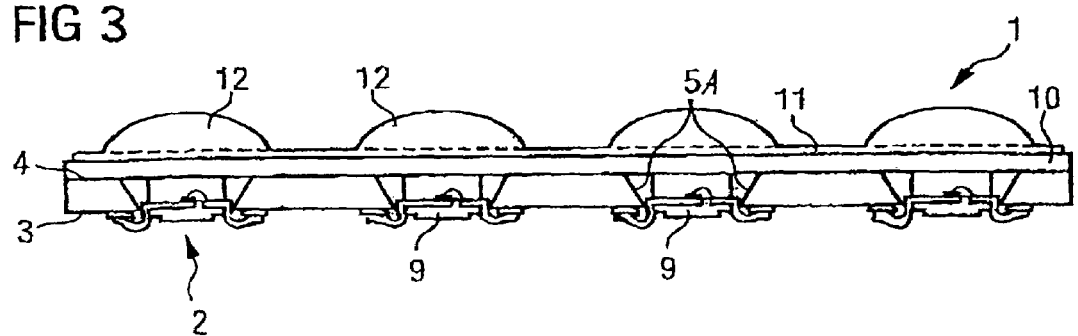
FIG. 3 shows a diagrammatic sectional illustration similar to that of FIG. 2, but with the side walls of openings 2 expanding conically toward the front side of the light-emitting diode carrier 1.

In this exemplary embodiment, the side walls 5 are embodied in straight fashion, but the openings 2 may also expand toward the front side 4 of the light-emitting diode carrier 1, which makes it easier for beams to be reflected to the front side 4 of the light-emitting diode carrier 1 and thus to radiate through the openings 2. The expansion of the openings 2 may be configured conically, as shown by side walls 5A in FIG. 3, but it is also possible to use any other advantageous geometry. In the arrangement of FIG. 3, the side walls 5A can be made of a transparent plastic.

In this exemplary embodiment, the front side 4 of the light-emitting diode carrier 1 is colored black, so that it absorbs radiation. It results in a high contrast between light-emitting diodes and light-emitting diode carrier 1 during operation of the light-emitting diodes.

In order to achieve a different desired contrast, the front side of the light-emitting diode carrier may also have any other desired color instead of black.

FIG. 2 shows a light-emitting diode carrier 1 in which the essential difference from the light-emitting diode carrier from exemplary embodiment in FIG. 1 is that a film 10 is applied on the front side of the light-emitting diode carrier, said film being transmissive to the radiation emitted by the light-emitting diodes. In order to achieve specific effects, the film may also be only partly radiation-transmissive, polarizing or focusing (e.g. by being formed as a Fresnel optic). The film principally fulfills the task of protecting the light-emitting diode carrier. Since the light-emitting diodes do not project to the front side of the light-emitting diode carrier, the film can easily be applied onto the whole area or a big part of the area of the plane surface of the front side.

In addition to the film, a lens array 11 is arranged on the front side of the light-emitting diode carrier, a lens 12 of the lens array 11 being situated above a respective opening 2. The lens array may also constitute part of the protective film or be applied instead of the film.

It goes without saying that the invention is not restricted to the exemplary embodiments described in concrete terms, but rather extends to all apparatuses which have the fundamental features of the invention. In particular, it can be used for light-emitting diode carriers having different geometry. A light-emitting diode carrier according to the invention can be provided in all apparatuses in which light-emitting diodes are intended to be protected from ambient influences in a simple manner and the intention is to achieve a high contrast between light-emitting diodes and a nonactive carrier. The invention encompasses any new feature and also any combination of features, which in particular comprises any combination of features in the patent claims, even if said combination is not explicitly specified in the patent claims.

We claim:

1. A light-emitting diode carrier having a plurality of light-emitting diodes, wherein the light-emitting diode carrier comprises a circuit board that has a substantially planar front face at a front side, a substantially planar rear face, opposite from the front face, at a rear side and a plurality of openings, extending from the rear face to the front face, the plurality of light-emitting diodes being arranged on the rear side of the light-emitting diode carrier so that at least a portion of the light-emitting diodes extends into the openings and the light emitting diodes radiate toward the front side of the light-emitting diode carrier, and wherein the light-emitting diodes are electrically connected on the rear side of the light-emitting diode carrier and do not extend beyond the front side of the carrier.

2. The light-emitting diode carrier as claimed in claim 1, wherein side walls of the openings have a reflective surface.

3. The light-emitting diode carrier as claimed in claim 1, wherein the openings expand toward the front side of the light-emitting diode carrier.

4. The light-emitting diode carrier as claimed in claim 1, wherein the openings expand conically toward the front side of the light-emitting diode carrier.

5. The light-emitting diode carrier as claimed in claim 1, wherein a film which is transmissive to the radiation emitted by the light-emitting diodes is arranged on a front side of the light-emitting diode carrier.

6. The light-emitting diode carrier as claimed in claim 1, wherein a lens array is arranged on the front side of the light-emitting diode carrier in such a way that a lens of the lens array is arranged above a respective opening.

7. The light-emitting diode carrier as claimed in claim 6, wherein the lens array is reversibly arranged such that it can be repositioned based on the desired radiation characteristic.

8. The light-emitting diode carrier as claimed in claim 6, wherein each light-emitting diode is assigned to an individual lens of the lens array.

9. The light-emitting diode carrier as claimed in claim 1, wherein the light-emitting diode carrier is formed in radiation-absorbing fashion on the front side.

10. The light-emitting diode carrier as claimed in claim 1, wherein the light-emitting diode carrier is colored black on the front side or is colored with a different color in order to set a desired contrast.

11. The light-emitting diode carrier as claimed in claim 1, wherein the light-emitting diodes are electrically connected to conductor tracks on the rear side of the light-emitting diode carrier.

12. The light emitting diode carrier as claimed in claim 1 wherein the light-emitting diode carrier is a solid body.

13. The light emitting diode carrier as claimed in claim 1 wherein the light-emitting diode carrier is a printed circuit board.

* * * * *